(12) United States Patent
Wu et al.

(10) Patent No.: US 8,645,793 B2
(45) Date of Patent: Feb. 4, 2014

(54) STATISTICAL TRACKING FOR FLASH MEMORY

(75) Inventors: Zining Wu, Los Altos, CA (US); Xueshi Yang, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 1013 days.

(21) Appl. No.: 12/417,268

(22) Filed: Apr. 2, 2009

(65) Prior Publication Data
US 2009/0300465 A1    Dec. 3, 2009

Related U.S. Application Data

(60) Provisional application No. 61/058,326, filed on Jun. 3, 2008.

(51) Int. Cl.
*G06F 11/00* (2006.01)

(52) U.S. Cl.
USPC .......................................................... 714/763

(58) Field of Classification Search
USPC .......................................... 714/763; 711/102
See application file for complete search history.

(56) References Cited

U.S. PATENT DOCUMENTS

| | | | |
|---|---|---|---|
| 4,041,456 A | 8/1977 | Ott et al. | |
| 4,686,574 A * | 8/1987 | Erhardt | 348/324 |
| 4,805,140 A | 2/1989 | Grimes et al. | |
| 5,239,505 A | 8/1993 | Fazio et al. | |
| 5,404,485 A * | 4/1995 | Ban | 711/202 |
| 5,574,684 A | 11/1996 | Tomoeda | |
| 5,734,612 A | 3/1998 | Yoshikawa | |
| 5,751,635 A | 5/1998 | Wong et al. | |
| 5,825,243 A | 10/1998 | Sato et al. | |
| 5,867,429 A | 2/1999 | Chen et al. | |
| 5,926,413 A | 7/1999 | Yamada et al. | |
| 5,937,425 A * | 8/1999 | Ban | 711/103 |
| 6,115,285 A | 9/2000 | Montanari et al. | |
| 6,224,553 B1 | 5/2001 | Nevo | |
| 6,279,133 B1 | 8/2001 | Vafai et al. | |
| 6,385,111 B2 | 5/2002 | Tran et al. | |
| 6,396,744 B1 | 5/2002 | Wong | |
| 6,445,628 B1 | 9/2002 | Pereira et al. | |
| 6,501,812 B1 | 12/2002 | Yada | |

(Continued)

FOREIGN PATENT DOCUMENTS

| | | |
|---|---|---|
| GB | 2 418 820 A | 4/2006 |
| KR | 20000016640 | 3/2000 |

(Continued)

OTHER PUBLICATIONS

The International Search Report and the Written Opinion of the International Searching Authority, or the Declaration mailed Mar. 3, 2009 for International Application No. PCT/US2008/074414 filed Aug. 27, 2008; 13 pages.

(Continued)

*Primary Examiner* — Yair Leibovich

(57) ABSTRACT

A system includes a read module, a statistical data generating module, and a storing module. The read module reads charge levels of nonvolatile memory cells and generates read signals. The statistical data generating module generates statistical data based on the read signals. The storing module stores the statistical data. The read module generates the read signals based on the charge levels of the nonvolatile memory cells and the statistical data.

19 Claims, 16 Drawing Sheets

(56) References Cited

U.S. PATENT DOCUMENTS

| | | | |
|---|---|---|---|
| 6,504,778 B1 | 1/2003 | Uekubo | |
| 6,519,264 B1 | 2/2003 | Carr et al. | |
| 6,522,586 B2 | 2/2003 | Wong | |
| 6,538,922 B1 | 3/2003 | Khalid et al. | |
| 6,590,804 B1 | 7/2003 | Perner | |
| 6,674,900 B1 | 1/2004 | Ma et al. | |
| 6,678,192 B2 | 1/2004 | Gongwer et al. | |
| 6,781,857 B1 | 8/2004 | Lien et al. | |
| 6,791,880 B1 | 9/2004 | Kurihara et al. | |
| 6,873,543 B2 | 3/2005 | Smith et al. | |
| 7,116,597 B1 | 10/2006 | Goldman et al. | |
| 7,126,844 B2 | 10/2006 | Theel | |
| 7,319,602 B1 | 1/2008 | Srinivasan et al. | |
| 7,505,295 B1 | 3/2009 | Nataraj et al. | |
| 7,505,318 B2 | 3/2009 | Fukuda et al. | |
| 7,535,787 B2 | 5/2009 | Elmhurst et al. | |
| 7,542,350 B2 | 6/2009 | Park et al. | |
| 7,583,536 B2 | 9/2009 | Iioka et al. | |
| 7,649,793 B1 | 1/2010 | Ramamoorthy et al. | |
| 7,808,834 B1 | 10/2010 | Sutardja | |
| 7,885,090 B1 | 2/2011 | Gabai | |
| 7,936,630 B1 | 5/2011 | Ramamoorthy et al. | |
| 7,941,590 B2 | 5/2011 | Yang et al. | |
| 8,363,501 B1 | 1/2013 | Ramamoorthy et al. | |
| 2001/0019510 A1 | 9/2001 | Aue | |
| 2001/0053104 A1 | 12/2001 | Tran et al. | |
| 2002/0196510 A1 | 12/2002 | Hietala et al. | |
| 2004/0027958 A1 | 2/2004 | Takeuchi et al. | |
| 2005/0013165 A1* | 1/2005 | Ban | 365/185.2 |
| 2005/0102048 A1* | 5/2005 | Anderson et al. | 700/94 |
| 2005/0281126 A1* | 12/2005 | Kato | 365/232 |
| 2006/0142988 A1 | 6/2006 | Akiyama et al. | |
| 2006/0161831 A1 | 7/2006 | Mehalel | |
| 2007/0067704 A1 | 3/2007 | Altintas et al. | |
| 2007/0076464 A1 | 4/2007 | Koebernick et al. | |
| 2007/0171730 A1 | 7/2007 | Ramamoorthy et al. | |
| 2007/0189073 A1 | 8/2007 | Aritome | |
| 2007/0245214 A1 | 10/2007 | Ramamoorthy | |
| 2008/0005362 A1 | 1/2008 | Wong | |
| 2008/0092026 A1 | 4/2008 | Brandman et al. | |
| 2008/0162791 A1 | 7/2008 | Eldredge et al. | |
| 2008/0291724 A1 | 11/2008 | Litsyn et al. | |
| 2008/0310224 A1 | 12/2008 | Roohparvar et al. | |
| 2009/0003073 A1* | 1/2009 | Rizel et al. | 365/185.18 |
| 2009/0034337 A1 | 2/2009 | Aritome | |
| 2010/0131826 A1 | 5/2010 | Shalvi et al. | |
| 2010/0180073 A1* | 7/2010 | Weingarten et al. | 711/103 |

FOREIGN PATENT DOCUMENTS

| | | |
|---|---|---|
| KR | 20030043976 | 6/2003 |
| WO | WO97/48099 | 12/1997 |
| WO | WO 02/27729 A2 | 4/2002 |
| WO | WO2007/132453 A | 11/2007 |

OTHER PUBLICATIONS

U.S. Appl. No. 60/884,763, filed Jan. 2004, Sutardja.
U.S. Appl. No. 60/797,591, filed May 2006, Ramamoorthy et al.
U.S. Appl. No. 60/864,468, filed Nov. 2006, Yang et al.
U.S. Appl. No. 60/910,325, filed Apr. 2007, Yang et al.
U.S. Appl. No. 11/738,263, filed Apr. 2007, Ramamoorthy et al.
U.S. Appl. No. 12/055,470, filed Mar. 2008, Sutardja.
U.S. Appl. No. 12/191,616, filed Aug. 2008, Yang et al.
U.S. Appl. No. 12/350,068, filed Jan. 2009, Yang et al.

* cited by examiner

| Block Index | Estimated mean value | Estimated standard deviations | Near optimal or optimal mean values | Near optimal or optimal detection thresholds |
|---|---|---|---|---|
| 0 | $m_0, m_1, \ldots$ | $\sigma_0, \sigma_1, \ldots$ | $\tilde{m}_0, \tilde{m}_1, \ldots$ | $t_1, t_2, \ldots$ |
| 1 | | | | |
| 2 | | | | |
| 3 | | | | |
| ⋮ | | | | |

FIG. 11

STATISTICAL TRACKING FOR FLASH MEMORY

CROSS-REFERENCE TO RELATED APPLICATIONS

This application claims the benefit of U.S. Provisional Application No. 61/058,326, filed on Jun. 3, 2008.

This application is related to U.S. Provisional Application No. 60/797,591 filed on May 4, 2006; U.S. Provisional Application No. 60/864,468 filed on Nov. 6, 2006; U.S. Provisional Application No. 60/910,325 filed on Apr. 5, 2007; U.S. application Ser. No. 11/738,263, filed on Apr. 20, 2007; U.S. application Ser. No. 12/055,470, filed on Mar. 26, 2008; U.S. application Ser. No. 12/191,616, filed on Aug. 14, 2008; and U.S. application Ser. No. 12/350,068 filed on Jan. 7, 2009.

The disclosures of the above applications are incorporated herein by reference in their entirety.

FIELD

The present disclosure relates to semiconductor memory, and more particularly to statistically tracking drifts in threshold distributions of memory cells.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Memory integrated circuits (ICs) comprise memory arrays. The memory arrays include memory cells arranged in rows and columns. The memory cells may include cells of volatile or nonvolatile memory. Volatile memory loses data stored in the memory cells when power is removed from the memory cells. Nonvolatile memory retains data stored in the memory cells when power is removed from the memory cells.

The memory cells in the rows and columns of a memory array are addressed by word lines (WLs) that select the rows and bit lines (BLs) that select the columns. The memory ICs comprise WL and BL decoders that select the WLs and BLs, respectively, during read/write (RAW) and erase/program (EP) operations.

Referring now to FIG. 1, a memory IC 10 comprises a memory array 12, a WL decoder 16, a BL decoder 18, and a control module 19. The memory array 12 comprises memory cells 14 arranged in rows and columns as shown. The WL and BL decoders 16, 18 select the WLs and BLs, respectively, depending on the addresses of the memory cells 14 selected during RAN and EP operations.

The control module 19 receives commands (e.g., read, write, erase, program, etc.) from a host (not shown). The control module 19 reads and writes data in the selected memory cells 14. Additionally, the control module 19 erases and programs the selected memory cells 14 when the memory cells 14 include cells of nonvolatile memory such as flash memory.

For example only, the memory cells 14 may include cells of NAND or NOR flash memory. Each memory cell 14 may be programmed to store N binary digits (bits) of information, where N is an integer greater than or equal to 1. Accordingly, each memory cell 14 may have $2^N$ states. To store N bits per cell, each memory cell 14 may comprise a transistor having $2^N$ programmable threshold voltages (hereinafter threshold voltages). The $2^N$ threshold voltages of the transistor represent the $2^N$ states of the memory cell 14, respectively.

Referring now to FIG. 2, a memory cell 14-$i$ may comprise a transistor 50 having a threshold voltage $V_T$. The transistor 50 may comprise a floating gate G (hereinafter gate G), a source S, and a drain D. The amount of charge stored in the gate G during a write operation determines the value of threshold voltage $V_T$ and the state of the memory cell 14-$i$.

For example only, the transistor 50 may have two programmable threshold voltages $V_{T1}$ and $V_{T2}$ depending on the amount of charge stored in the gate G. When the amount of charge stored in the gate G is Q1, the threshold voltage of the transistor 50 is $V_{T1}$. When the amount of charge stored in the gate G is Q2, the threshold voltage of the transistor 50 is $V_{T2}$. Depending on the amount charge stored in the gate G, a gate voltage (i.e., $V_{GS}$) having a value greater than or equal to $V_{T1}$ or $V_{T2}$ may turn on the transistor 50 (i.e., generate the predetermined drain current).

The state of the memory cell 14 (i.e., data stored in the memory cell 14) is read by measuring the threshold voltage $V_T$ of the transistor 50. The threshold voltage $V_T$ is measured by applying the gate voltage to the gate G and sensing the drain current. The drain current is sensed by applying a small voltage across the source S and the drain D of the transistor 50.

When the gate voltage is less than the threshold voltage $V_T$, the transistor 50 is off, and the drain current is low (approximately zero). When, however, the gate voltage is greater than or equal to the threshold voltage $V_T$, the transistor 50 turns on, and the drain current becomes high (i.e., equal to the predetermined drain current corresponding to the $V_T$). The value of the gate voltage that generates the high drain current represents the threshold voltage $V_T$ of the transistor 50.

Typically, states of memory cells in a block or a page of a memory array are sensed at a time. The gates of the transistors of the memory cells in the block are connected to a WL. The WL is selected, and a voltage is applied to the WL. The states of N-bit memory cells are sensed by stepping through $(2^N-1)$ voltages on the WL and determining the threshold voltages of the transistors when the drain currents of the transistors first exceed a predetermined (preprogrammed) value.

Referring now to FIGS. 3A and 3B, the threshold voltage of the transistor 50 is measured as follows. For example only, the transistor 50 may have one of four threshold voltages $V_{T1}$ to $V_{T4}$, where $V_{T1}<V_{T2}<V_{T3}<V_{T4}$. Accordingly, the memory cell 14-$i$ may have one of four states 00, 01, 10, and 11.

In FIG. 3A, the control module 19 comprises a voltage generator 20 and current sensing amplifiers 22. The voltage generator 20 and the current sensing amplifiers 22 may be collectively called a read module. The number of current sensing amplifiers is equal to the number of BLs. For example, when the IC 10 comprises B BLs, the current sensing amplifiers 22 include B current sensing amplifiers for B BLs, respectively, where B is an integer greater than 1.

In FIG. 3B, the WL decoder 16 selects a WL comprising memory cells 14-1, 14-2, ..., 14-$i$, ..., and 14-$n$ (collectively memory cells 14) when the states of the memory cells are to be determined. Each of the memory cells 14 includes a transistor similar to the transistor 50. The transistors are shown as capacitances C that store the charge in the gates.

When a read operation begins, the voltage generator 20 supplies a voltage (e.g., a staircase voltage) to the WL decoder 16. The WL decoder 16 inputs the voltage to the selected WL. Accordingly, the voltage is applied to the gates of the transistors on the selected WL.

The current sensing amplifiers 22 include one current sensing amplifier for each BL. For example, a current sensing amplifier 22-i communicates with a bit line BL-i and senses the drain current that flows through the transistor 50 of the memory cell 14-i. The current sensing amplifier 22-i senses the drain current by applying a small voltage across the source and the drain of the transistor 50.

Each current sensing amplifier senses the drain current that flows through the respective one of the transistors of the memory cells 14. The control module 19 measures the threshold voltages of the transistors based on the drain currents sensed by the respective current sensing amplifiers 22.

SUMMARY

A system comprises a read module, a statistical data generating module, and a storing module. The read module reads charge levels of nonvolatile memory cells and generates read signals. The statistical data generating module generates statistical data based on the read signals. The storing module stores the statistical data. The read module generates the read signals based on the charge levels of the nonvolatile memory cells and the statistical data.

In other features, the system further comprises an updating module that updates the statistical data stored in the storing module based the read signals. The statistical data includes at least one of a mean, a detection threshold, a standard deviation, and a variance of each charge level distribution of the nonvolatile memory cells.

In other features, the system further comprises an updating module that conditionally updates the statistical data stored in the storing module based on at least one of a number of read errors detected during read operations and a number of program operations of the nonvolatile memory cells.

In other features, the storing module stores mean values of the charge levels used to program the nonvolatile memory cells, and the system further comprising an updating module that conditionally updates the mean values based on the statistical data.

In other features, the system further comprises a least mean square (LMS) module that is used to generate the statistical data based on signals received from the nonvolatile memory cells during read operations.

In other features, the statistical data generating module comprises a detecting module, a signal reconstructing module, a delay buffer, and a difference module. The detecting module generates data based on the read signals. The signal reconstructing module generates reconstructed signals based on the data. The delay buffer buffers the read signals and that outputs delayed read signals. The difference module generates differences between the reconstructed signals and the delayed read signals.

In other features, a memory integrated circuit (IC) comprises the system and further comprising a memory array that includes the nonvolatile memory cells.

In other features, the system further comprises a statistical data processing module that processes the statistical data stored in the storing module using at least one of Viterbi detection and iterative decoding.

In still other features, a method comprises reading nonvolatile memory cells, generating statistical data based on the reading, storing the statistical data, and generating read signals based on the statistical data when the nonvolatile memory cells are read.

In other features, the method further comprises generating at least one of a mean, a detection threshold, a standard deviation, and a variance of each charge level distribution of the nonvolatile memory cells based on the read signals. The method further comprises conditionally updating the statistical data based on at least one of a number of read errors detected during read operations and a number of program operations of the nonvolatile memory cells.

In other features, the method further comprises storing mean values of the charge levels used to program the nonvolatile memory cells, generating updated mean values by conditionally updating the mean values based on the statistical data, and programming the nonvolatile memory cells using the updated mean values.

In other features, the method further comprises using a least mean square (LMS) module to generate the statistical data based on signals received from the nonvolatile memory cells during read operations.

In other features, the method further comprises updating the statistical data during read operations of the nonvolatile memory cells.

In other features, the method further comprises generating the statistical data by generating data based on the read signals, generating reconstructed signals based on the data, buffering the read signals, outputting delayed read signals, and generating differences between the reconstructed signals and the delayed read signals.

In other features, the method further comprises processing the statistical data using at least one of Viterbi detection and iterative decoding.

In still other features, the systems and methods described above are implemented by a computer program executed by one or more processors. The computer program can reside on a computer readable medium such as but not limited to memory, nonvolatile data storage, and/or other suitable tangible storage mediums. The systems and methods can also be implemented as a state machine in hardware.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIG. 11 is an exemplary lookup table utilized by the control module of FIG. 9;

DESCRIPTION

Figure 2:
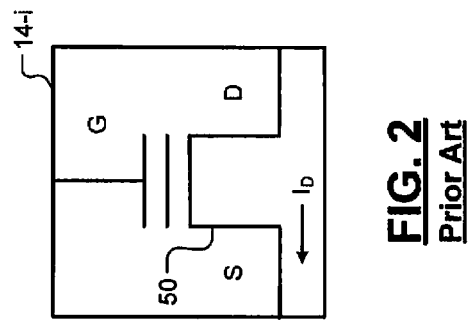
FIG. 2 is a schematic of a multi-level memory cell.
Figure 1:
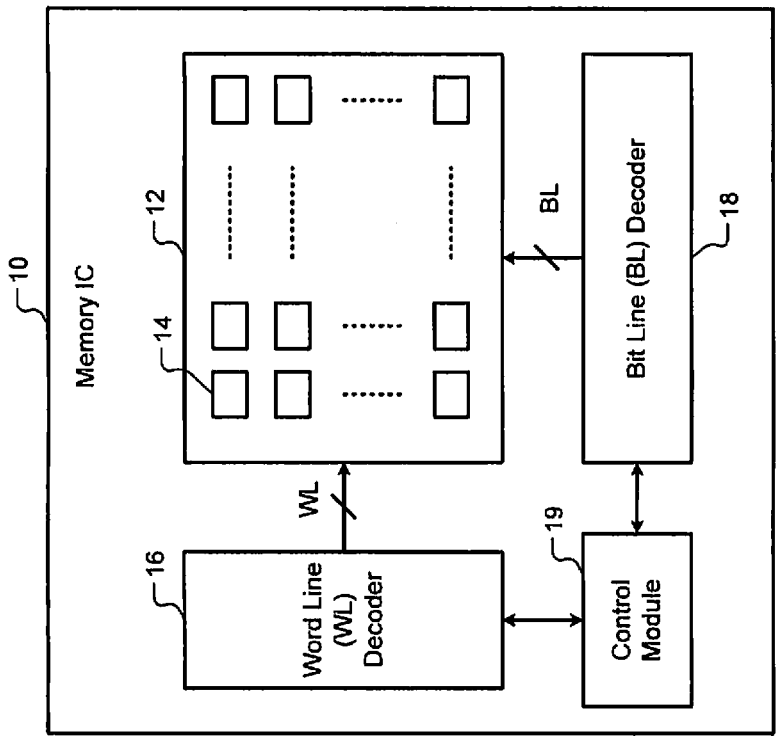
FIG. 1 is a functional block diagram of a memory integrated circuit (IC)
Figure 3A:
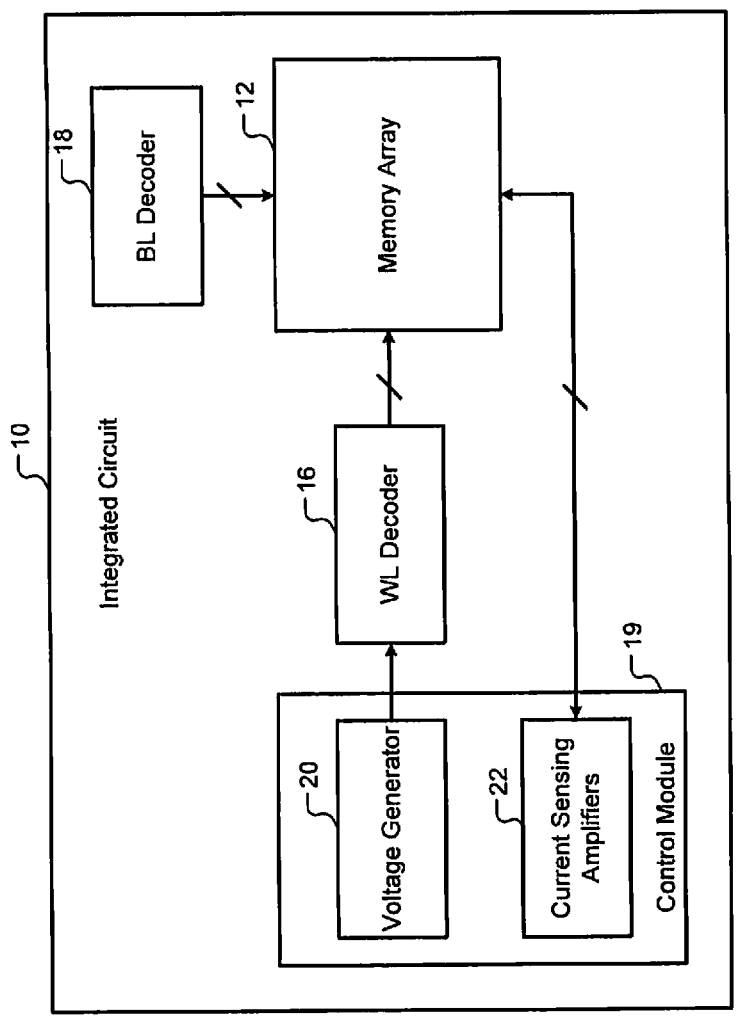
FIGS. 3A and 3B are functional block diagrams of the memory IC of FIG. 1.
Figure 3B:
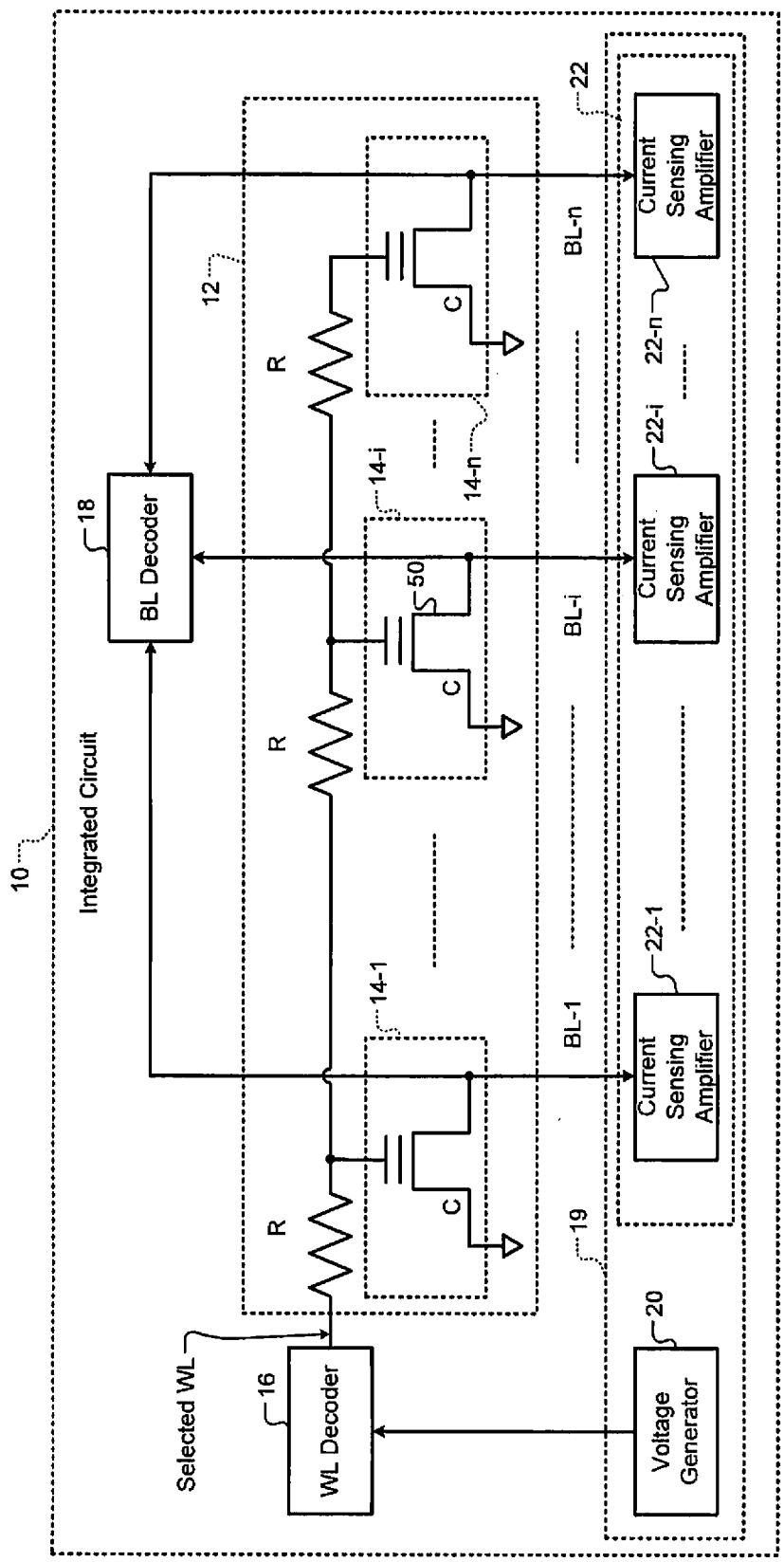

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

States of nonvolatile memory cells that store data by storing different amounts of charge can be sensed by measuring threshold voltages and/or drain currents of the memory cells and by comparing the threshold voltages and/or the drain currents to predetermined thresholds. The threshold voltages and/or the drain currents are hereinafter collectively referred to as read signals, readback signals, or readout signals sensed from the memory cells.

For example, flash memory cells store data by trapping granulized amounts of charge in an isolated region of a transistor called a floating gate. Data is typically retrieved from the memory cell by applying a read voltage to the transistor and subsequently estimating the readout current, which is determined by the amount of charge trapped in the memory cell.

Memory cells may store one or more bits per cell and may be called single-level or multi-level memory cells, respectively. A single-level memory cell may store one bit of information. For example, the bit may be a logic 0 when a charge is stored in the memory cell or a logic 1 when no charge stored in the memory cell.

On the other hand, the multi-level memory cells may store more than one bit of information by storing varying amounts of charge or charge levels. For example, suppose Q is the maximum amount of charge that can be trapped in a multi-level memory cell. More than one bit of information can be stored in such a memory cell by storing a granulized amount of charge between 0 and Q. For example, two bits of information may be stored in one multi-level memory cell by trapping any one of four levels of charges: 0, Q/3, 2Q/3, Q. This process of trapping charges may be referred to as programming. These various levels of trapped charges translate into different threshold voltages for the memory cell. The information stored in the memory cell can be retrieved by estimating the amount of charge stored in the memory cell.

Generally, programming multi-level memory cells precisely with a desired amount of charge can be difficult. The actual programmed amount of charge approximately follows a Gaussian distribution centered on a desired charge level. A statistical variance (hereinafter variance) of the distribution may be determined based on a programming method used and physical properties of the memory cells, Consequently, threshold voltage distributions of the memory cells are also Gaussian.

Figure 4:
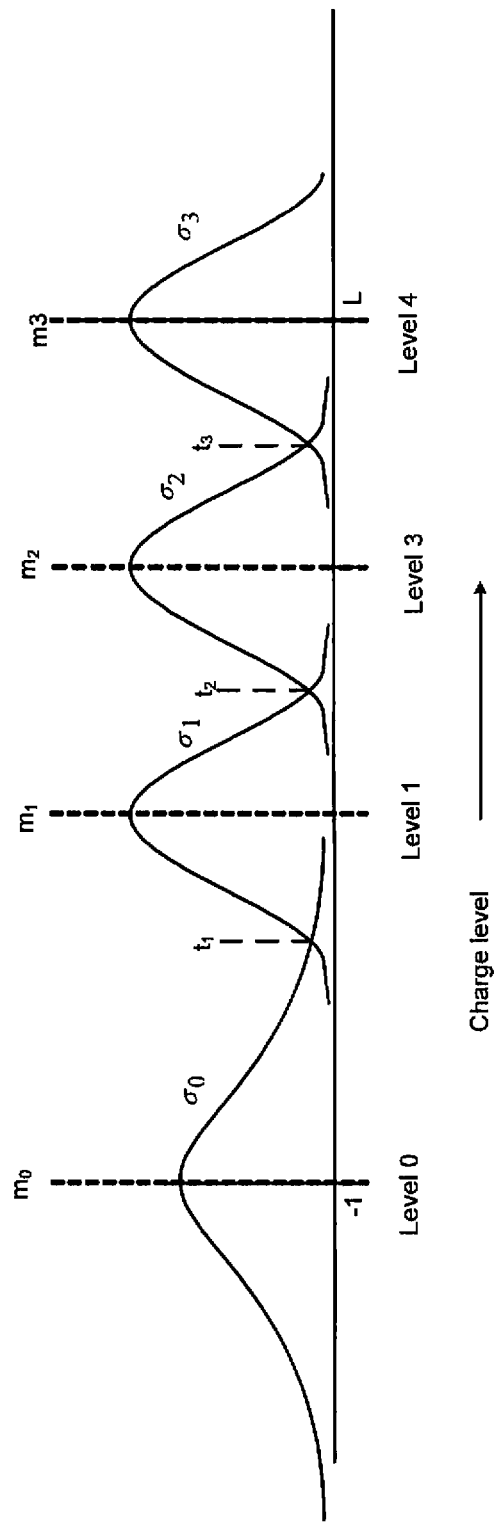
FIG. 4 depicts charge level distributions of a 2-bit memory cell.

Referring now to FIG. 4, an exemplary threshold voltage distribution (hereinafter level distribution) for a 2-bit memory cell is shown. The distribution includes four levels that are associated with four different levels of charge that may be stored in the memory cell. Each level has a mean and a variance.

The mean of each level determines a mean value of the amount of charge that may be trapped in the memory cell to program the memory cell to the corresponding charge level during write operations. In other words, the mean of each level determines a mean value of the program voltage that may be applied to the memory cell to trap the charge in the memory cell and to program the memory cell to the corresponding charge level during write operations.

Additionally, intersections of the four charge levels (level 0, level 1, level 2, and level 3) define three detection thresholds (t1, t2, and t3) that may be used to detect the data stored in the memory cell during read operations. The three detection thresholds (t1, t2, and t3) are located where curves of two adjacent level distributions intersect.

Generally, to read and write data from and to a multi-level memory cell, two things should be known: the detection thresholds and the means of the level distributions of the multi-level memory cell. Specifically, the detection thresholds (e.g., t1, t2, and t3) should be known to read data from the memory cell, and the means (e.g., m1, m2, m3, and m4) of the level distributions should be known to write data to the memory cell. The words "means" and "mean values" are hereinafter used interchangeably and synonymously.

The detection thresholds should be known during a read operation of a multi-level memory cell to determine whether the charge stored in the memory cell is at level 0, level 1, level 2, or level 3. On the other hand, the means should be known during a write operation of a multi-level memory cell to accurately target the amount of charge to be programmed into the memory cell.

For example, during a read operation, to determine whether the total charge stored in a multi-level memory cell is at level 0, the value of the first detection threshold (t1) should be known. By knowing the value of t1, one can determine whether the charge stored (or not stored since level 0 could be zero charge) in the memory cell is less than t1 to determine whether the stored charge is at level 0. Similarly, to determine whether the charge stored in the memory cell is at level 1, one can determine whether the charge stored in the memory cell is between t1 and t2, and so on.

On the other hand, during a write operation, to target the right amount of charge to program the multi-level memory cell, the means of the level distribution should be known. For example, to store level 2 amount of charge in the memory cell, the second mean value (m1) should be known to properly program the memory cell. By targeting m1 amount of charge to be stored in the memory cell, writing errors may be minimized since m1 is located at the top of the Gaussian curve.

Figure 5:
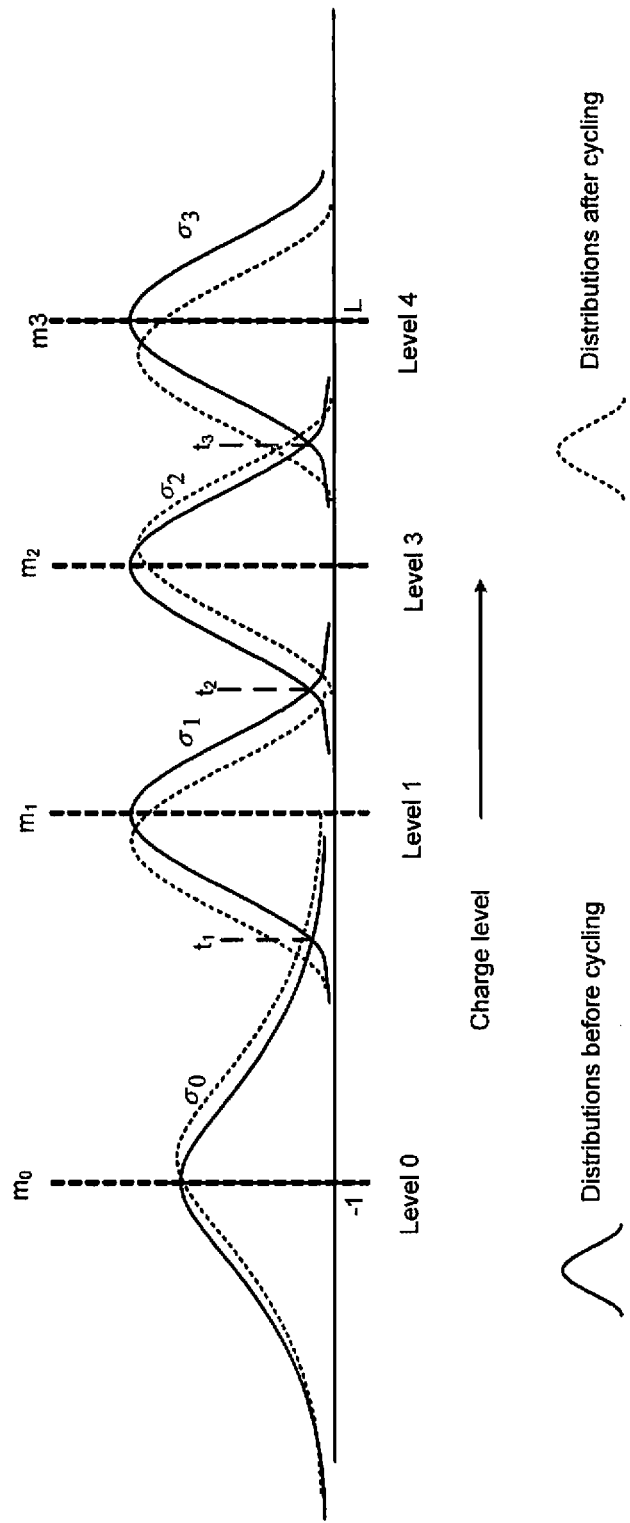
FIG. 5 depicts drifts in the level distributions of FIG. 4 due to cycling of the memory cell.

Referring now to FIG. 5, memory cells such as the multi-level flash memory cells may be subjected to retention loss after repeated read, write, erase, and/or program operations (collectively called cycling). For example, the oxide surrounding the floating gates of the memory cells may degenerate after repeated cycling. Consequently, the mean and variance of the level distributions may change or drift after cycling as shown by dotted curves. Additionally, although not shown, the detection thresholds may change or drift after cycling. Hereinafter, the term drift may be used to describe variations in the level distributions due to cycling.

Accordingly, after cycling, data written using initial mean values from before cycling may be inaccurate unless the initial mean values are adjusted for the drift due to cycling. Additionally, after cycling, data read using initial detection thresholds from before cycling may be incorrect unless the initial detection thresholds are adjusted for the drift due to cycling.

To account for the drift due to cycling and to minimize errors during read and write operations after cycling, memory control systems that control the RAN and EP operations of the memory cells may track the changes to the level distributions due to cycling. Additionally, the memory control systems may adaptively adjust the RAN and EP processes to mitigate the detrimental effects of repeated cycling.

For example, the memory control systems may generate estimated means and detection thresholds to facilitate writing and reading data to and from the multi-level memory cells, respectively. In some implementations, the memory control systems may generate the estimated means and detection thresholds by processing signal samples provided by a subset of the multi-level memory cells called pilot cells.

Typically, operations performed on the multi-level memory cells that store user data are mimicked onto the pilot cells. Accordingly, the pilot cells experience the same degradation due to cycling as the degradation experienced by the memory cells that store the user data. Since data stored in the pilot cells can be known a priori, the signal samples provided by the pilot cells can be used to generate the estimated means and detection thresholds.

Based on the estimated mean and detection threshold values, optimal or near optimal mean and detection threshold values may be generated for a memory cell or a group of memory cells. The optimal or near optimal mean and detection threshold values may then be stored in a look-up table (LUT). Using the optimal or near optimal means and detection threshold values during subsequent write and read operations may minimize errors due to cycling.

Generally, the accuracy of the estimated means and detection thresholds is directly proportional to the number of pilot cells used for estimating the means and detection thresholds. In other words, the greater the number of pilot cells, the better the accuracy of the estimates. Using a large number of pilot cells, however, reduces the number of memory cells available to store user data. In other words, the greater the number of pilot cells, the smaller the storage capacity of the memory array.

Additionally, frequently generating new values of means and detection thresholds and updating the old values of the means and detection thresholds stored in the LUT with the new values (e.g., after each read operation) can slow the processes of reading and writing data.

Accordingly, the present disclosure relates to generating the estimated means and detection thresholds by tracking the memory cells that store data instead of reserving pilot cells for tracking. By not reserving some of the memory cells as pilot cells for generating the estimates, the usable memory capacity of the memory array can be increased.

Additionally, the estimates may be generated and stored in memory instead of in the LUT. In addition, statistical data generated by tracking the memory cells (e.g., mean, standard deviation, and variance) may be stored in the memory. The estimates and the statistical data stored in the memory may be updated periodically. The values of means and detection thresholds stored in the LUT are updated selectively. For example, the values of means and detection thresholds stored in the LUT are updated only when a number of EP cycles or a number of read errors are greater than or equal to a programmable threshold.

More specifically, the means and detection thresholds may be estimated by generating statistical data for memory cells that store user data. The estimated means and detection thresholds and the statistical data may be directly stored in memory and may be updated periodically. The estimated means and detection thresholds and the statistical data stored in the memory may be refined by tracking statistical data generated during read operations.

The updated values of the means and detection thresholds stored in the memory may be used to selectively update the values of the means and detection thresholds stored in the LUT when some conditions are detected. For example, the conditions may include a number of EP cycles, number of read errors, and so on. The conditions may be detected based on the statistical data tracked and stored in memory.

Thus, in some implementations, the means and detection thresholds stored in the LUT are updated only selectively instead of during each read operation. The updated values of the means and detection thresholds used to update the corresponding values stored in the LUT are simply retrieved from memory instead of generating the estimates at the time of updating the values in the LUT.

Additionally, the statistical data stored in the memory may be subsequently processed to improve accuracy of read/write operations when drift due to cycling occurs. For example, the statistical data stored in the memory may be used to perform Viterbi detection, iterative decoding, and so on to improve accuracy of read/write operations when drift due to cycling occurs.

Figure 6A:
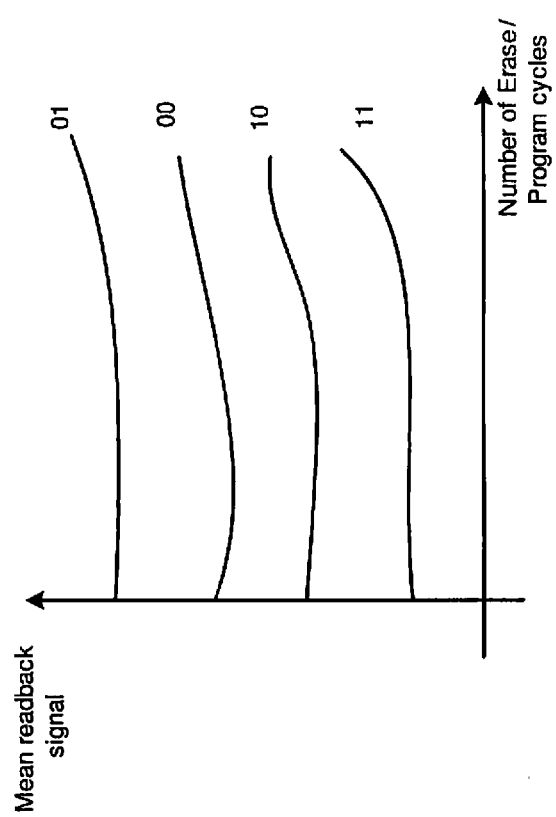
FIG. 6A depicts drifts in values of mean threshold voltages due to cycling of the memory cell.
Figure 6B:
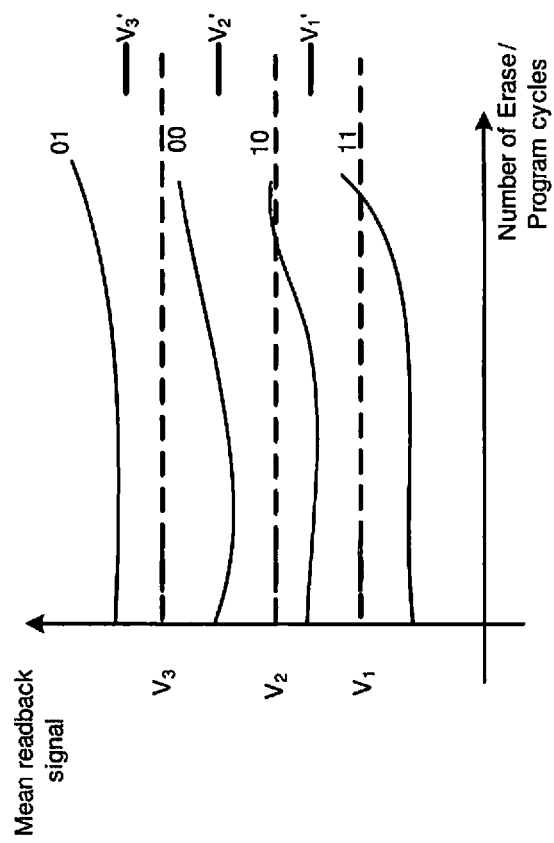
FIG. 6B depicts drifts in values of detection thresholds due to cycling of the memory cell.

Referring now to FIGS. 6A and 6B, for example only, the threshold distribution may drift as a function of erase/program (EP) cycles. In FIG. 6A, after cycling, the mean values for programming the memory cells may drift from initial mean values. In FIG. 6B, after cycling, the detection thresholds used for comparison during read operations may drift from initial detection thresholds. For example only, the initial mean values and the initial detection thresholds may be determined at the time of manufacturing (i.e., before the memory cells are first used to store data.) Alternatively, the initial values may include the last updated values.

The drift in the mean values and the detection thresholds due to cycling may cause errors in programming the memory cells and in determining the state of the memory cells, respectively. To reduce the errors, the mean values and the detection thresholds may be adjusted to compensate for the drift. For example, the mean values and the detection thresholds may be adjusted (i.e., adapted) to match the changed characteristics of the memory cells by statistically monitoring the changes in the characteristics of the memory cells due to cycling.

In FIG. 6B, for example only, changes in the detection thresholds due to cycling are shown. Similar changes may occur in the mean values. Accordingly, although changes in mean values are not separately discussed below, the following discussion related to the detection thresholds in reference to FIG. 6B also applies to the mean values.

As shown, the initial detection thresholds for the memory cell may be (t1, t2, t3) when the memory cell is first used after manufacturing, for example. After N number of EP cycles, the detection thresholds for the memory cell may drift from (t1, t2, t3) to (t1', t2', t3'). Consequently, the state of the memory cell cannot be correctly determined unless the detection thresholds are adjusted from (t1, t2, t3) to (t1', t2', t3') after the number of EP cycles to compensate for the drift. Let (t1', t2', t3') denote updated detection thresholds after N number of EP cycles, for example. Any criteria other than or in addition to the number of EP cycles may be used to decide when to update the initial detection thresholds.

Typically, to update the initial detection thresholds, a plurality of memory cells may be read during a read operation. For example, in flash memory, a page or a block of memory cells may be read during a read cycle. (Hereinafter, the words page and block are used synonymously and interchangeably.) Accordingly, the initial detection thresholds (t1, t2, t3) for a block of memory cells can be stored in memory that is associated with the block.

The memory used to store the initial detection thresholds may be nonvolatile so that the initial detection thresholds can be stored and updated periodically. For example only, the memory used to store the initial detection thresholds may include a portion of the memory array used to store user data. In some implementations, the initial detection thresholds for a block may be stored adjacent to the block. Alternatively, the memory used to store the initial detection thresholds may be different from the memory used to store user data. For example, the memory may include a storage device such as a disk drive.

The initial detection thresholds (t1, t2, t3) stored in the memory may be periodically updated by adaptive tracking using a least mean square (LMS) method, for example. Alternatively, the initial detection thresholds (t1, t2, t3) may be periodically updated using a predetermined formula. The predetermined formula may be a function of EP cycles, read errors and/or other suitable criteria.

On the other hand, the detection thresholds (including the initial and updated detection thresholds) stored in the LUT may be updated based on a schedule. For example, the detection thresholds stored in the LUT may be periodically updated after every N EP cycles, where N can be a programmable integer. For example only, N=1000. Thus, for example, the updated detection thresholds (t1', t2', t3') stored in the LUT may be updated again to (t1", t2", t3") after another N EP cycles.

In some implementations, after determining the updated detection thresholds (t1', t2', t3'), only the differences between the initial and updated detection thresholds may be stored instead of storing the updated detection thresholds (t1', t2', t3'). For example, the differences $\Delta t1=(t1'-t1)$, $\Delta t2=(t2'-t2)$, and $\Delta t3=(t3'-t3)$ may be stored. The differences may be called deltas for the block.

Subsequently, when the block of memory cells is read, the updated detection thresholds or the deltas for the block are read. The states of the memory cells are determined by comparing the readback signals received from the memory cells to the updated detection thresholds or the deltas for the block.

In some implementations, the updated detection thresholds or the deltas for the block may be further refined using the data read from the block. The refined values of the detection thresholds can be used to update the stored detection thresholds or deltas for the block.

For write operations, the mean values may be updated and stored in a similar manner in which the detection thresholds are updated and stored as described above. When a block is first programmed, a set of mean values (e.g., the initial mean values) may be initialized and stored in the LUT for the block. The initialized mean values may be a function of the number of EP cycles performed on the block. Additionally or alternatively, the initialized mean values may be a function of the mean values that were stored before the block was last erased. The initial mean values stored in the LUT may be selectively updated during subsequent read operations (e.g., after every N EP cycles). The updated mean values are used during subsequent write operations.

Additionally, during read operations, statistical data including mean, standard deviation, and variance of the readback signals for each level may be stored in memory. The statistical data may be periodically updated during read operations. The statistical data may be used for many purposes. For example, the statistical data may be used to detect portions of the memory array comprising problematic memory cells (e.g., memory cells having high error rates). A portion of the memory array may be determined to be problematic based on a low signal-to-noise ratio (SNR) sensed when reading the memory cells in the portion. Accordingly, based on the statistical data, a stronger error correcting code (ECC) may be used when writing data to the problematic portion.

Figure 7:
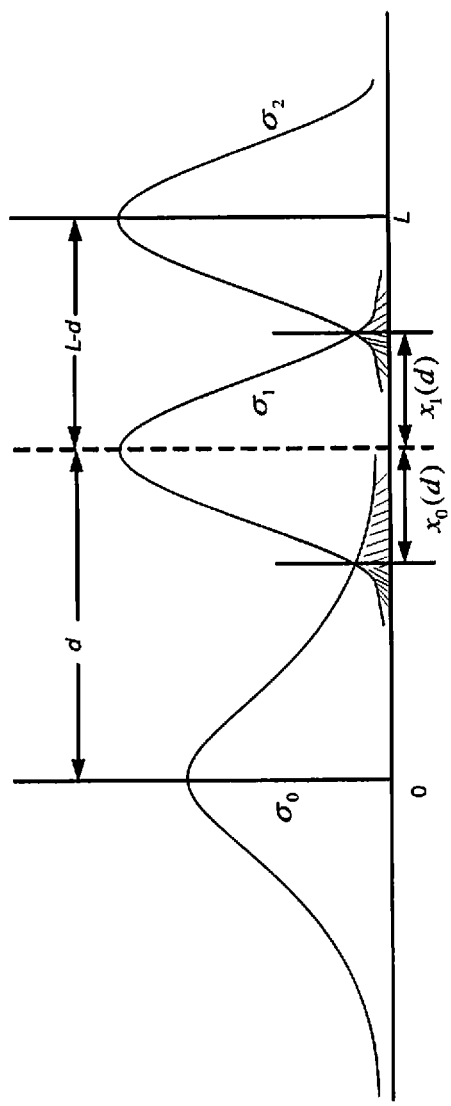
FIG. 7 depicts a 3-level charge distribution of a memory cell.
Figure 8:
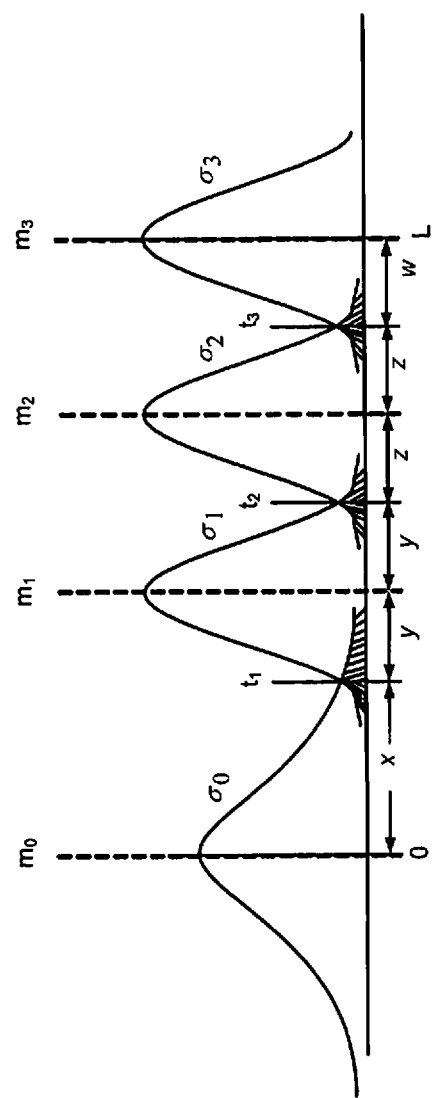
FIG. 8 depicts a 4-level charge distribution of a memory cell.

Referring now to FIGS. 7 and 8, the estimation and updating of the mean values and the detection thresholds can be mathematically explained as follows. Throughout the disclosure, the mean and detection threshold values are referred to as "optimal or near optimal" values. The "optimal or near optimal" values as used herein refer to the mean and detection threshold values that may be generated using an optimal solution. The optimal solution may include a simple near optimal (i.e., approximate) solution or a complex solution that uses additional computing power.

These values may be generated and stored in memory when a read operation is performed on multi-level memory cells. Based on the read operation, approximate estimates for means and variances of the level distributions of the multi-level memory cells may be generated, which may be used to derive the optimal or near optimal solutions. Alternatively, the estimated means and standard deviations may be generated based on the behavior of the memory cells learned over a period of time or based on a model of the behavior generated based on the design of the memory cells.

Estimating the means and standard deviations is described in co-pending U.S. patent application Ser. No. 11/738,263, filed on Apr. 20, 2007 and titled "Channel Estimation for Multi-Level Flash Memories Using Pilot Signals," which is hereby incorporated by reference in its entirety.

Alternatively, online adaptation methods may be employed for estimating the means and standard deviations. For example, a least mean square (LMS) method may be used to estimate the means and variances based on data recovered from the memory cells. In the LMS method, voltages can be applied to at least a sub-set of the memory cells, which may or may not include the pilot cells. When the voltages are applied, the memory cells may output signal samples that may be read and processed to estimate the means and variances of the level distributions of the memory cells. Once the means and standard deviations for the level distributions are estimated, optimal detection thresholds can be found based on the estimated means and standard deviations.

Typically, many parameters associated with multi-level memory cells are functions of physical properties of the memory cells. For example, the means and standard deviations of the lowest and highest level distributions (e.g., the level distributions of level 0 and level 3 of FIG. 4) are functions of physical properties of the memory cells.

Given these values, programming of the memory cells can be optimized by adjusting the means (except for the means associated with the lowest and highest level distributions). In addition, for detecting the state of the memory cells during read operations, the detection threshold values may be optimized according to the current or most recent level distributions for minimum probability of error.

In FIG. 7, a 3-level charge distribution is used as an example for mathematically explaining how to obtain optimal mean and detection threshold values. In the example, the respective standard deviations for the 3 levels are $\sigma_0$, $\sigma_1$, and $\sigma_2$. For purposes of illustration, assume that the level distribution means fall in a range between 0 and L, where L is a distance or range between the mean of the lowest level distribution (i.e., the left-most level distribution) and the mean of the highest level distribution (i.e., the right-most level distribution).

Let a difference between the mean of the left-most level distribution and the mean of the middle level distribution be denoted by d. Accordingly, a difference between the mean of the right-most level distribution and the mean of the middle level distribution may be denoted by (L−d). Once d is given, the crossing points of probability density functions (pdf's), which denote the detection thresholds, may be determined. In the example shown, the distances of the crossing points from the mean of the middle level distribution are denoted by $x_0(d)$ and $x_1(d)$, respectively.

According to signal detection theory, the optimal detection thresholds for multi-level memory cells are the crossing points of the pdf's. In the following discussion, the pdf's are first shown to maintain the same value at the crossing points (i.e., detection thresholds) when minimum probability of error is achieved. The shaded areas shown correspond to the error regions.

The probability of making an error in detection is given by the following equation:

$$P_e = \int_{\frac{d-x_0(d)}{\sigma_0}}^{\infty} N(0,1) + \int_{\frac{x_0(d)}{\sigma_1}}^{\infty} N(0,1) + \int_{\frac{x_1(d)}{\sigma_1}}^{\infty} N(0,1) + \int_{\frac{L-d-x_1(d)}{\sigma_2}}^{\infty} N(0,1)$$

where $N(0,1)$ denotes the standard Gaussian distribution function with zero mean and variance 1.

Taking the derivative of $P_e$ with respect to d, it follows that $$\frac{\partial P_e}{\partial d} = 0 = g\left(\frac{d-x_0(d)}{\sigma_0}\right) \cdot \frac{1}{\sigma_0} \cdot \frac{\partial(d-x_0(d))}{\partial d} + \quad \text{Eq. (1)}$$
$$g\left(\frac{x_0(d)}{\sigma_1}\right) \cdot \frac{1}{\sigma_1} \cdot \frac{\partial(x_0(d))}{\partial d} + g\left(\frac{x_1(d)}{\sigma_1}\right) \cdot \frac{1}{\sigma_1} \cdot \frac{\partial(x_1(d))}{\partial d} +$$
$$g\left(\frac{L-d-x_1(d)}{\sigma_2}\right) \cdot \frac{1}{\sigma_2} \cdot \frac{\partial(L-d-x_1(d))}{\partial d}$$

where $g(x) = \frac{1}{\sqrt{2\pi}} e^{-x^2/2}$.

Note that $$g\left(\frac{d-x_0(d)}{\sigma_0}\right) \cdot \frac{1}{\sigma_0} = g\left(\frac{x_0(d)}{\sigma_1}\right) \cdot \frac{1}{\sigma_1}$$

and $$g\left(\frac{x_1(d)}{\sigma_1}\right) \cdot \frac{1}{\sigma_1} = g\left(\frac{L-d-x_1(d)}{\sigma_2}\right) \cdot \frac{1}{\sigma_2}$$

Accordingly, $$g\left(\frac{d-x_0(d)}{\sigma_0}\right) \cdot \frac{1}{\sigma_0} = g\left(\frac{L-d-x_1(d)}{\sigma_2}\right) \cdot \frac{1}{\sigma_2}$$

The above equation results after canceling out the equal terms in Eq. (1). Extensions to more than 3 levels are similar. For ease of reference, the above property will be hereinafter referred to as "Equal Value Property."

In FIG. 8, for example, the "Equal Value Property" may be used to solve the optimization problem for a 4-level charge distribution shown. For the 4-level charge distribution shown, the mean range is between 0 and L. The means of the level distributions are denoted as $m_0$, $m_1$, $m_2$, and $m_3$. The detection thresholds for the level distributions are denoted as $t_1$, $t_2$, and $t_3$. The respective standard deviations of the level distributions are denoted as $\sigma_0$, $\sigma_1$, $\sigma_2$, and $\sigma_3$. The distances between the means and the detection thresholds are depicted as x, y, z, and w.

To determine the optimal solutions for x, y, z, and w, the following set of equations may be used:

$$\begin{cases} \frac{1}{\sigma_0} e^{-\frac{x^2}{2\sigma_0^2}} = \frac{1}{\sigma_1} e^{-\frac{y^2}{2\sigma_1^2}} = \frac{1}{\sigma_2} e^{-\frac{z^2}{2\sigma_2^2}} = \frac{1}{\sigma_3} e^{-\frac{w^2}{2\sigma_3^2}} \\ x + 2y + 2z + w = L \end{cases}$$

Numerical approaches may be used to solve the above equations. For example, Newton's method can be used. Let a constant C be defined as follows:

$$\begin{cases} \frac{1}{\sigma_0} e^{-\frac{x^2}{2\sigma_0^2}} = \frac{1}{\sigma_1} e^{-\frac{y^2}{2\sigma_1^2}} = \frac{1}{\sigma_2} e^{-\frac{z^2}{2\sigma_2^2}} = \frac{1}{\sigma_3} e^{-\frac{w^2}{2\sigma_3^2}} = C \\ x + 2y + 2z + w = L \end{cases} \quad \text{Eq. (2)}$$

Now, C may be found by using Newton's method to solve $$f(x) = x + 2y + 2z + w - L$$
$$= g(\sigma_0, C) + 2g(\sigma_1, C) + 2g(\sigma_2, C) + g(\sigma_3, C) - L$$

where $g(\sigma, C) = \sigma\sqrt{-2\ln(\sigma C)}$

After taking the derivative of f(x) with respect to C, the following equation is obtained:

$$df(x)/dC = d(x + 2y + 2z + w - L)/dC$$
$$= \frac{-\sigma_0}{g(\sigma_0, C)} + \frac{-2\sigma_1}{g(\sigma_1, C)} + \frac{-2\sigma_2}{g(\sigma_2, C)} + \frac{-\sigma_3}{g(\sigma_3, C)}$$

Now, C can be found through the following iteration:

$$C_{n+1} = C_n - \frac{f(C_n)}{f'(C_n)}$$

The solution converges fast for good initial values of C. Once C is solved, the x, y, z, and w values may easily follow. Thus, the optimal solution can be obtained.

Although, the above solution may be accurate, approximations may be used to simplify the computation and obtain a near optimal solution. For example, taking the logarithm of the first equation of Eq. (2), the following equation may be obtained:

$$\frac{x^2}{2\sigma_0^2} = \frac{y^2}{2\sigma_1^2} + \ln\left(\frac{\sigma_1}{\sigma_0}\right) \quad \text{Eq. (3)}$$

Note that for practical applications, the ratio between $\sigma_1$ and $\sigma_0$ is close to 1, which after taking the logarithm is negligible when compared to other terms in Eq. (3). Accordingly, ignoring the term $$\ln\left(\frac{\sigma_1}{\sigma_0}\right),$$

it follows that $$\frac{x}{\sigma_0} = \frac{y}{\sigma_1}$$

Similar approximations also hold true for z and w. Thus, the near optimal solutions may be obtained as $$\begin{cases} x = \frac{\sigma_0}{\sigma_0 + 2\sigma_1 + 2\sigma_2 + \sigma_3}L \\ y = \frac{\sigma_1}{\sigma_0 + 2\sigma_1 + 2\sigma_2 + \sigma_3}L \\ z = \frac{\sigma_2}{\sigma_0 + 2\sigma_1 + 2\sigma_2 + \sigma_3}L \\ w = \frac{\sigma_3}{\sigma_0 + 2\sigma_1 + 2\sigma_2 + \sigma_3}L \end{cases}$$

These solutions may be referred to as linearized solutions, and they are near optimal under practical operating conditions. That is, once x, y, z, and w are solved, approximate (i.e., near optimal) solutions may be determined for the mean and detection threshold values of 4-level memory cells. The above formulation may be easily extended to any M number of levels, where M>2.

Based on the above near optimal solution, and once the estimated mean and standard deviations for each distribution have been determined, the near optimal detection threshold values can be found. For example, suppose that the estimated mean and standard deviation values of the level distributions for a 4-level (2 biticell) flash memory device are found to be $\{m_i, i=0, 1, 2, 3\}$ and $\{\sigma_i, i=0, 1, 2, 3\}$, respectively.

Utilizing the linearized solution (i.e., near optimal solution), the threshold values are obtained as follows:

$$\begin{cases} t_1 = \frac{m_1\sigma_0 + m_0\sigma_1}{\sigma_0 + \sigma_1} \\ t_2 = \frac{m_2\sigma_1 + m_1\sigma_2}{\sigma_1 + \sigma_2} \\ t_3 = \frac{m_3\sigma_2 + m_2\sigma_3}{\sigma_2 + \sigma_3} \end{cases}$$

where $t_1$, $t_2$, and $t_3$ are the near optimal signal detection thresholds. Thus, the near optimal detection thresholds, $t_1$, $t_2$, and $t_3$ of a 4-level multi-level memory may be solved using the above equations. If additional accuracy is desired, exact solutions can be found by utilizing the Equal Value Property through the Newton's method illustrated previously.

In addition, the near optimal mean values for multi-level memory cells may be obtained as follows. For an M level memory cell, assume that the estimated means are denoted as $\{m_i, i=0, 1, \ldots, M-1\}$, and the corresponding standard deviations as $\{\sigma_i, i=0, 1, \ldots, M-1\}$. The mean values corresponding to the lowest ($m_0$) and highest levels ($m_{M-1}$) and the standard deviations are assumed to be predefined and set. The values of $m_i$, $i=1, 2, \ldots, M-2$ may be adjusted for optimal performance as follows.

By denoting $L=m_{M-1}-m_0$ and utilizing the linearized solutions, the near optimal mean value ($\tilde{m}$) for the i-th level is given by the following equation:

$$\tilde{m}_i = m_0 + \frac{\sigma_0 + 2\sum_{k=1}^{i-1}\sigma_k + \sigma_i}{\sigma_0 + 2\sum_{k=1}^{M-2}\sigma_k + \sigma_{M-1}}L \quad \text{Eq. (4)}$$

This equation may be used to solve for near optimal mean values of M-level distribution memory cells. Alternatively, the Newton's method may be used for additional accuracy.

Figure 9:
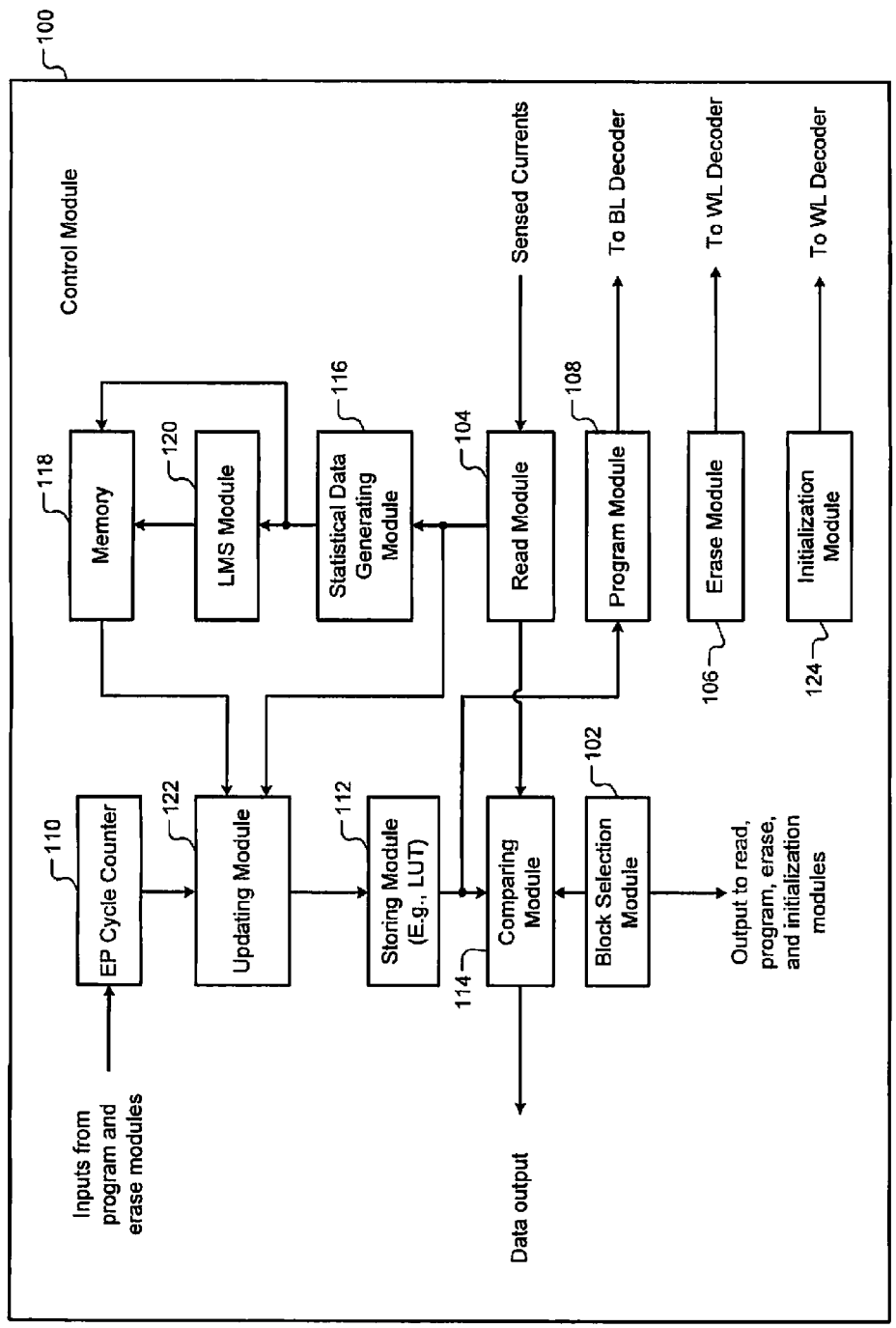
FIG. 9 is a functional block diagram of a control module that generates, stores, and updates statistical data of multi-level memory cells of a memory IC.

Referring now to FIG. 9, a system for storing and updating mean values and detection thresholds according to the present disclosure is shown. The system may be implemented by a control module 100 that controls read, write, erase, and program operations of the memory cells 14 of the memory array 12.

For example only, the memory cells 14 may include N-level memory cells of nonvolatile memory such as flash memory, where N is an integer greater than 1. Accordingly, the memory cells 14 may each have N level distributions. The N level distributions have N means, respectively. (N−1) detection thresholds may be used to determine the level of charge stored in each of the memory cells 14.

The control module 100 may generate and store in memory the statistical data of the memory cells 14. The control module 100 may generate the statistical data by reading the memory cells 14 during read operations. Based on the statistical data, the control module 100 may generate and store in memory the estimated mean values and detection thresholds for the memory cells 14.

The control module 100 may update the statistical data and the mean values and detection thresholds stored in memory as described below, The control module 100 may selectively update the mean values and detection thresholds stored in the LUT for each block of memory cells 14 as described below.

The control module 100 may comprise a block selection module 102, a read module 104, an erase module 106, a program module 108, and EP cycle counter 110, a storing module 112, a comparing module 114, a statistical data generating module 116, memory 118, a least mean square (LMS) module 120, and an updating module 122.

Additionally, the control module 100 may comprise an initialization module 124 that initializes the memory cells 14. In some implementations, memory 118 may include a plurality of the memory cells 14. In other implementations, memory 118 may be internal or external to the memory integrate circuit (IC) that comprises the control module 100 and the memory array 12.

The block selection module 102 selects a block of memory cells 14 to perform a read, write, erase, and/or program operations on the block. The block selection module 102 outputs control signals that indicate the selected block. The block selection module 102 outputs the control signals to the read module 104, the erase module 106, and/or the program module 108 when a read, erase, and/or a program operation is performed, respectively.

During a read operation, the read module 104 reads data stored in the memory cells 14 of the selected block and generates read signals. The read module 104 may comprise the voltage generator 20 and the current sensing amplifiers 22 (not shown). The read module 104 receives currents sensed from the memory cells 14 of the selected block. The read module 104 generates read signals based on the sensed currents.

During an erase operation, the erase module 106 erases the memory cells 14 of the selected block. During a program (i.e., write) operation, the program module 108 programs the memory cells 14 of the selected block. The EP cycle counter 110 counts the number of EP cycles performed on the selected block.

The storing module 112 may include a lookup table (LUT) that stores the initial and selectively updated values of the means and detection thresholds for each block. The initial values of the means and detection thresholds for each block of memory cells 14 are generated during manufacturing and are stored in the LUT in the storing module 112. The updating module 122 may selectively update the initial values and may selectively update the updated values as described below.

When a block is selected for reading, the comparing module 114 receives the read signals generated by the read module 104 by reading the selected block. The comparing module 114 compares the read signals to the detection thresholds stored in the LUT in the storing module 112 for the selected block.

Based on the comparison, the comparing module 114 detects the data stored in the memory cells 14 (i.e., determines the states of the memory cells 14) of the selected block. When a block is selected for writing, the program module 108 programs the block of memory cells 14 using the mean values stored in the LUT in the storing module 112 for the selected block.

The statistical data generating module 116 generates statistical data for each block when each block is read. The statistical data may include mean, standard deviation, and variance for each level distribution of the memory cells 14 of the blocks read during read operations. The statistical data for each block is stored in memory 118.

The LMS module 120 generates estimated values of means and detection thresholds for each block based on the statistical data generated for each block. Additionally, the LMS module 120 generates optimal or near optimal values of means and detection thresholds for each block based on the estimated values. In some implementations, the LMS module 120 may generate the statistical data based on signals received from the memory cells 14 of the blocks read during read operations.

For example, at time k, the LMS module 120 may update the estimated values generated at time (k−1). The updated values, also called adapted values (i.e., adapted or compensated for drift, if any), are stored in memory 118 for each block.

The updating module 122 may selectively update the mean and detection threshold values stored in the LUT for a block with the adapted values for the block stored in memory 118. The read module 104 and the program module 108 use the updated values stored in the LUT in the storing module 112 during subsequent read and write operations, respectively.

The updating module 122 may update the values stored in the LUT based on any of the following criteria: the EP cycle count stored in the EP cycle counter 110; a read error count that the updating module 122 may generate based on the read signals received from the read module 104; blocks detected as problematic based on an analysis performed by the updating module 122 of the statistical data stored in memory 118, etc.

For example, the updating module 122 may update the mean and detection threshold values stored in the LUT for each block when the EP cycle count stored in the EP cycle counter 110 is greater than or equal to a programmable threshold (e.g., after every 1000 EP cycles). The updating module 122 may update the values stored in the LUT for one or more blocks when the updating module 122 determines that the read error count when reading the one or more blocks is greater than or equal to a programmable threshold. The updating module 122 may update the values stored in the LUT for one or more blocks when the updating module 122 determines that the one or more blocks are problematic, and so on.

Accordingly, although not shown, the updating module 122 may comprise a read error detecting module, a statistical data analyzing module, and/or a bad block locator module. The read error detecting module may generate and store the read error count. The statistical data analyzing module may analyze the statistical data stored in memory 118. The bad block locator module may identify the problematic blocks based on the statistical analysis performed by the statistical data analyzing module.

Additionally, the updating module 122 may generate a control signal and output the control signal to the program module 108 when one or more problematic blocks are detected. Accordingly, the program module 108 may select a stronger error correcting code (ECC) to encode data when writing the data to the problematic blocks. Thus, the control module 100 may use the statistical data stored in memory 118 in many ways to maintain the integrity of data stored in the memory cells 14 of the memory array 12.

Figure 10:
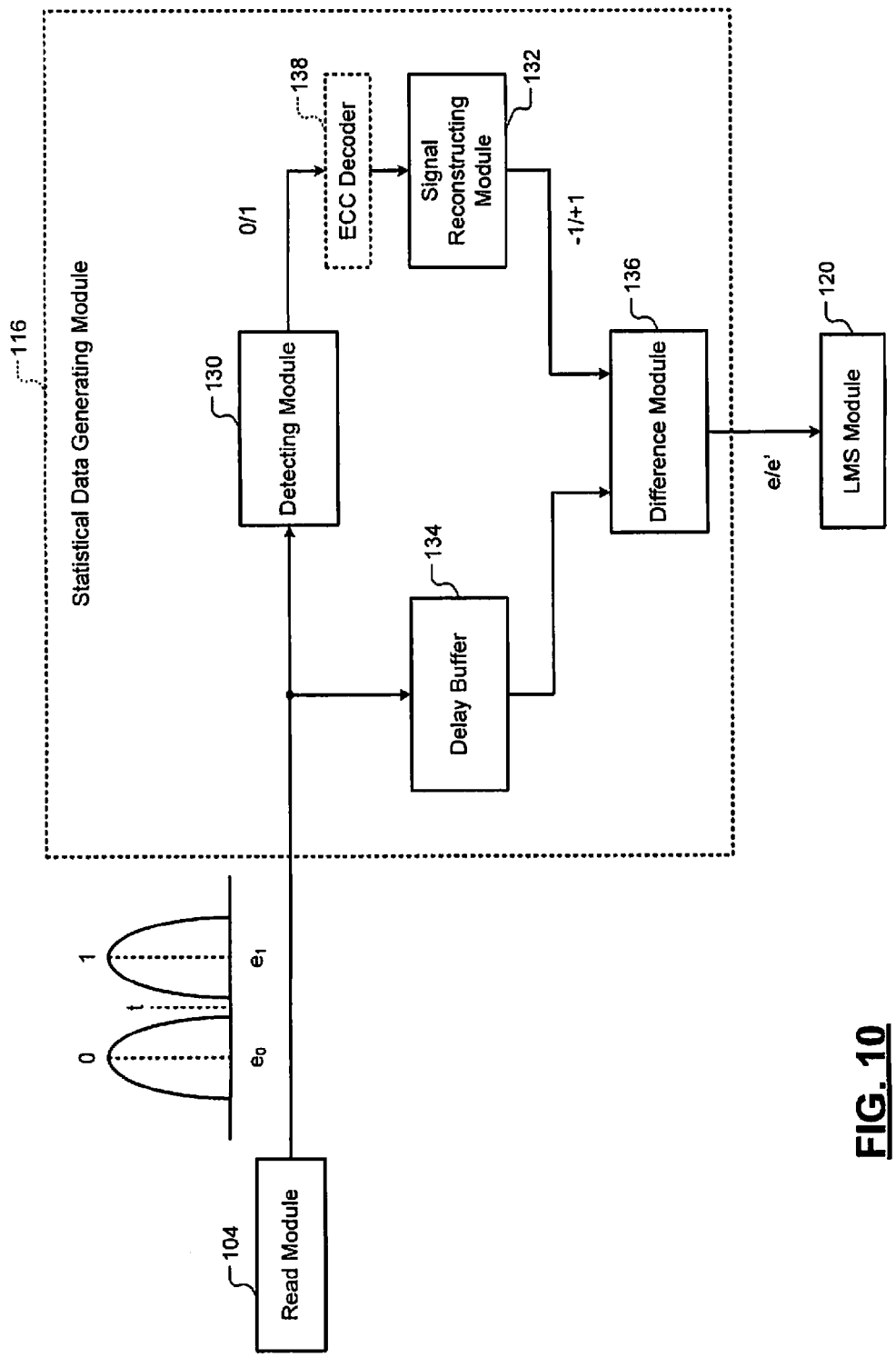
FIG. 10 is a functional block diagram of an exemplary statistical data generation module utilized by the control module of FIG. 9.

Referring now to FIG. 10, an exemplary implementation of the statistical data generating module 116 is shown. The statistical data generating module 116 may comprise a detecting module 130, a signal reconstructing module 132, a delay buffer 134, and a difference module 136.

For simplicity of illustration, suppose that the memory cells 14 include 1-bit memory cells each capable of storing a logic 0 or a logic 1. Accordingly, the memory cells 14 may have a 2-level distribution as shown. The two levels (i.e., level 0 and level 1) may have means of e0 and e1, respectively.

The detecting module 130 may comprise a slicer. The detecting module 130 receives the read signals generated by the read module 104 when a selected block is read. The detecting module 130 generates binary decisions (i.e., a 0 or a 1) based on the read signals received. In some implementations, the statistical data generating module 116 may additionally comprise an ECC decoder 138 to increase the accuracy of the binary decisions output by the detecting module 130.

The signal reconstructing module reconstructs the data output by the detecting module 130 (or, when used, the data output by the ECC decoder 138). For example, the signal reconstructing module 132 generates an output of −1 or +1 when the binary decision is 0 or 1, respectively.

The delay buffer 134 buffers the read signals to align the output of the delay buffer 134 with the output of the signal reconstructing module 132. In other words, the delay buffer 134 delays the read signals by an amount of delay between the detecting module 130 and the signal reconstructing module 132. Thus, the output of the delay buffer 134 is aligned in time (i.e., synchronized in time) with the output of the signal reconstructing module 132. The output of the signal reconstructing module 132 may be considered as an ideal signal while the output of the delay buffer 134 may considered as a signal including noise.

The difference module 136 generates a difference between the output of the delay buffer 134 and the corresponding output of the signal reconstructing module 132. For example, the difference is e or e' when the output of the signal reconstructing module 132 is −1 or +1, respectively. The difference is output to the LMS module 120.

Mathematically, the LMS module 120 generates the estimated mean values e0 and e1 and updates the estimated mean values as follows:

$$e0(k)=e0(k-1)+(\alpha * e)$$

$$e1(k)=e1(k-1)+(\alpha * e')$$

where e0(k) is the mean value e0 updated at time k. e1(k) is the mean value e1 updated at time k. e0(k−1) is the estimated value of the mean e0 at time (k−1). e1(k−1) is the estimated value of the mean e1 at time (k−1). e is the output of the difference module 136 when the output of the signal reconstructing module 132 is −1. e' is the output of the difference module 136 when the output of the signal reconstructing module 132 is +1. $\alpha$ is a programmable constant (i.e., a scaling factor) based on the drift in the level distributions of the memory cells 14 due to cycling.

Thus, the LMS module 120 updates the value of the mean e0 at time k by scaling the output e of the signal reconstructing module 132 by the constant $\alpha$ and by adding the scaled value of the output of the signal reconstructing module 132 to the value of the mean e0 at time (k−1). Similarly, the LMS module 120 updates the value of the mean e1 at time k by scaling the output e' of the signal reconstructing module 132 by the constant $\alpha$ and by adding the scaled value of the output of the signal reconstructing module 132 to the value of the mean e1 at time (k−1).

Subsequently, the LMS module 120 updates the value of the detection threshold t based on the updated mean values and the statistical data (e.g., standard deviation) generated by the statistical data generating module 116 as previously described. The estimated and updated values of the means and detection thresholds generated by the LMS module 120 for each block are stored in memory 118.

As described above, the updating module 122 selectively updates the values of the means and detection thresholds stored in the LUT in the storing module 112 with the updated values of the means and detection thresholds stored in memory 118. The read module 104 and the program module 108 use the updated values of the detection thresholds and means stored in the LUT in the storing module 112 for the selected block during subsequent read and write operations, respectively.

Referring now to FIG. 11, an exemplary LUT stored in the storing module 112 is shown. Initially, the LUT can be populated during manufacturing and/or testing stages. Alternatively, the LUT can be populated when the memory cells 14 are initialized by the initialization module 124 or when data is read from the memory cells 14.

Preferably, one row entry in the LUT corresponds to a block of memory cells 14. For each block, a row in the LUT stores at least the values of means and standard deviations of the level distributions for the block. The values are selectively updated and saved in the LUT by the updating module 122 as previously described. In addition, the optimal or near optimal solutions for the means and detection thresholds can be generated based on the updated values and saved in the LUT. In some implementations, the standard deviations for the level distributions may also be stored and updated in the LUT for each block.

During read operations, the read module 104 retrieves from the LUT the estimated means and detection thresholds for the selected block. The read module 104 processes the data read from the block based on these values that are selectively updated (i.e. adapted or compensated for the drift).

During write operations, the program module 108 retrieves from the LUT the optimal or near optimal mean values for the selected block. The program module 108 uses these values that are selectively updated (i.e. adapted or compensated for the drift) for programming the block.

Figure 12:
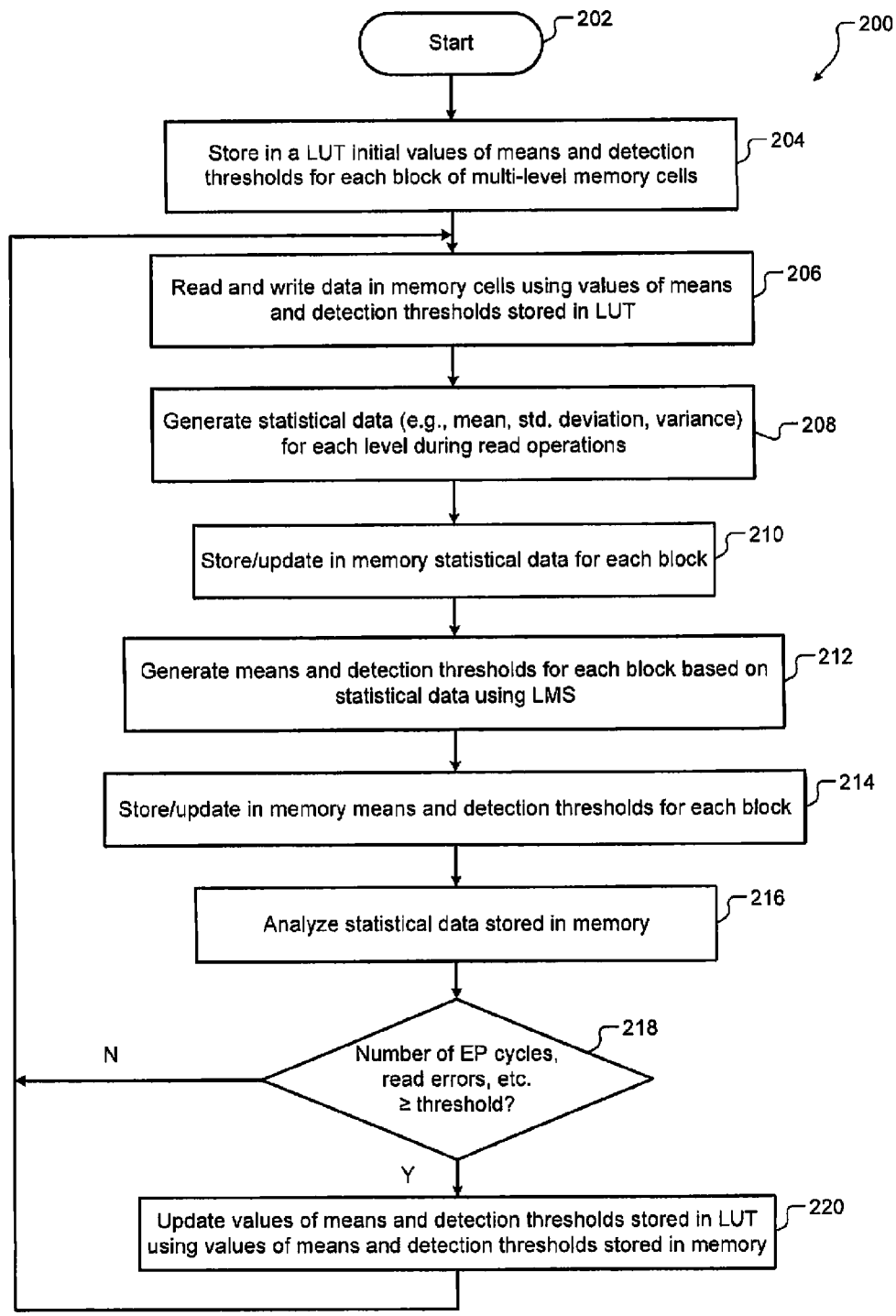
FIG. 12 is an exemplary method for generating, storing, and updating statistical data of multi-level memory cells of a memory IC.

Referring now to FIG. 12, an example of a method 200 for storing and updating mean values and detection thresholds according to the present disclosure is shown. Control begins in step 202. In step 204, control stores in the LUT the initial values of means and detection thresholds for each block of multi-level memory cells 14. In step 206, control writes and reads data in the memory cells 14 using the values of means and detection thresholds stored in the LUT, respectively.

In step 208, control generates statistical data (e.g., mean, standard deviation, and variance) for each level distribution of the memory cells 14 for each block during read operations. In step 210, control stores in memory 118 the statistical data generated for each block during the read operations. If the statistical data generated during prior read operations are already stored in memory 118, then control updates the statistical data stored in memory 118 with the statistical data generated during instant read operation.

In step 212, control generates means and detection thresholds for each block based on the statistical data using LMS. In step 214, control stores in memory 118 the means and detection thresholds for each block. If the means and detection thresholds generated during prior read operations are already stored in memory 118, then control updates the means and detection thresholds stored in memory 118 with the means and detection thresholds generated during instant read operation.

In step 216, control analyzes the statistical data stored in memory 118. For example, control may identify problematic blocks based on the analysis of the statistical data (e.g., standard deviation, variance, etc. associated with the blocks) and may select a stronger ECC when writing data to the problematic blocks.

In step 218, control determines if the number of EP cycles, read errors, etc. are greater than or equal to a programmable threshold. If the result of step 218 is false, control does not update the values of means and detection thresholds stored in the LUT. Control returns to step 206. Control continues to read and write data using the values of means and detection thresholds previously stored in the LUT.

If, however, the result of step 218 is true, control performs step 220. In step 220, control updates the values of means and detection thresholds stored in the LUT using the adapted values of means and detection thresholds stored in memory 118. Control returns to step 206. Control performs subsequent read and write operations using the updated values stored in the LUT.

Figure 13:
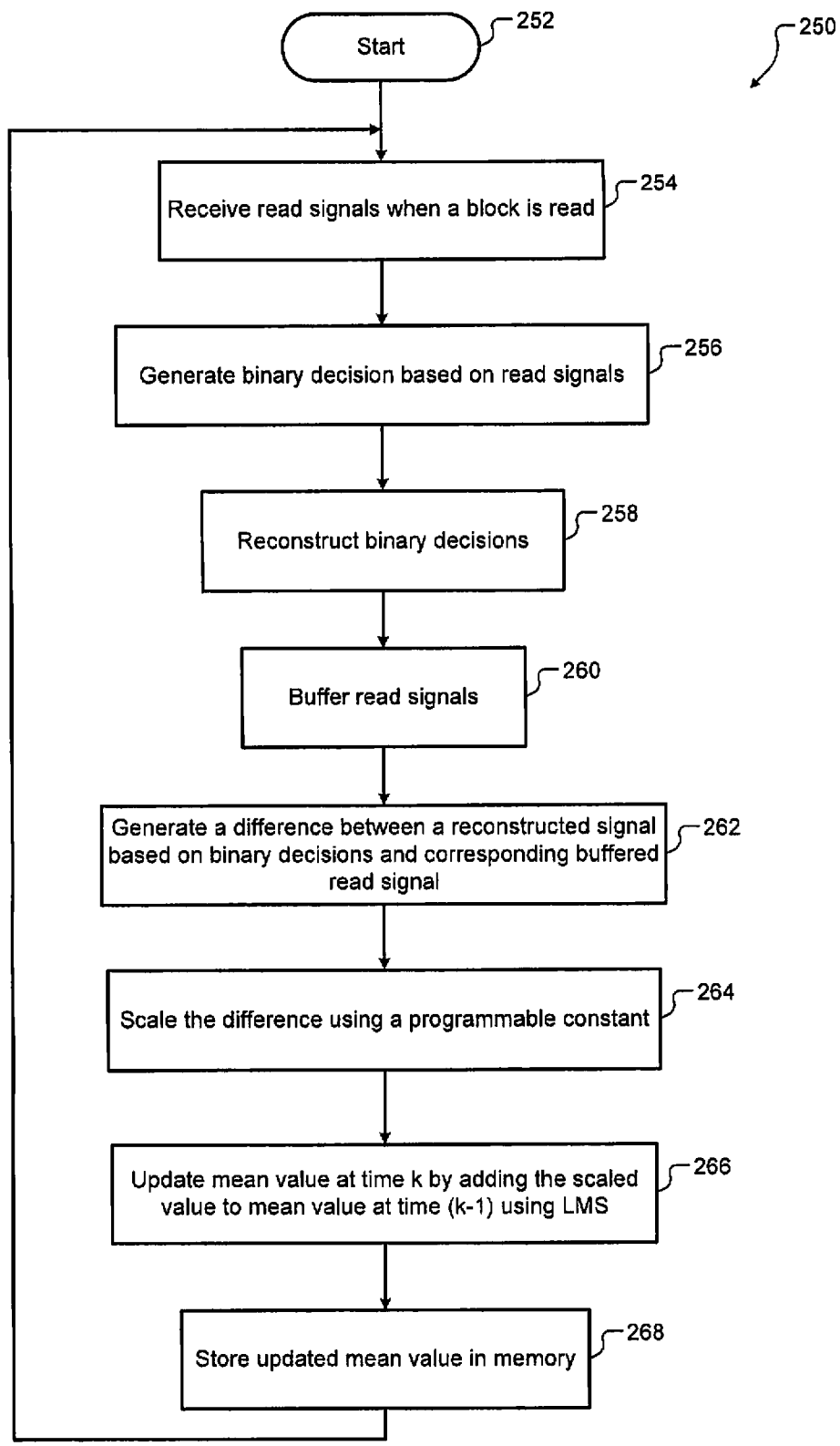
FIG. 13 is an exemplary method for tracking memory cells and generating statistical data of multi-level memory cells of a memory IC.

Referring now to FIG. 13, an example of a method 250 for tracking memory cells and generating statistical data including mean values according to the present disclosure is shown. Control begins in step 252. In step 254, control receives read signals when a block is read. In step 256, control generates binary decisions based on the read signals. In step 258, control generates reconstructed signals based on the binary decisions. In step 260, control buffers the read signals and outputs delayed read signals.

In step 262, control generates a difference between a reconstructed signal based on binary decisions and a corresponding buffered read signal. In step 264, control scales the difference using a programmable constant that tracks the drift in the level distributions of the memory cells 14. In step 266, control updates a mean value of a level generated at time k by adding the scaled value to the mean value generated of the level at time (k−1) using LMS. In step 268, control stores the updated mean value in memory 118, and control returns to step 254.

Figure 14:
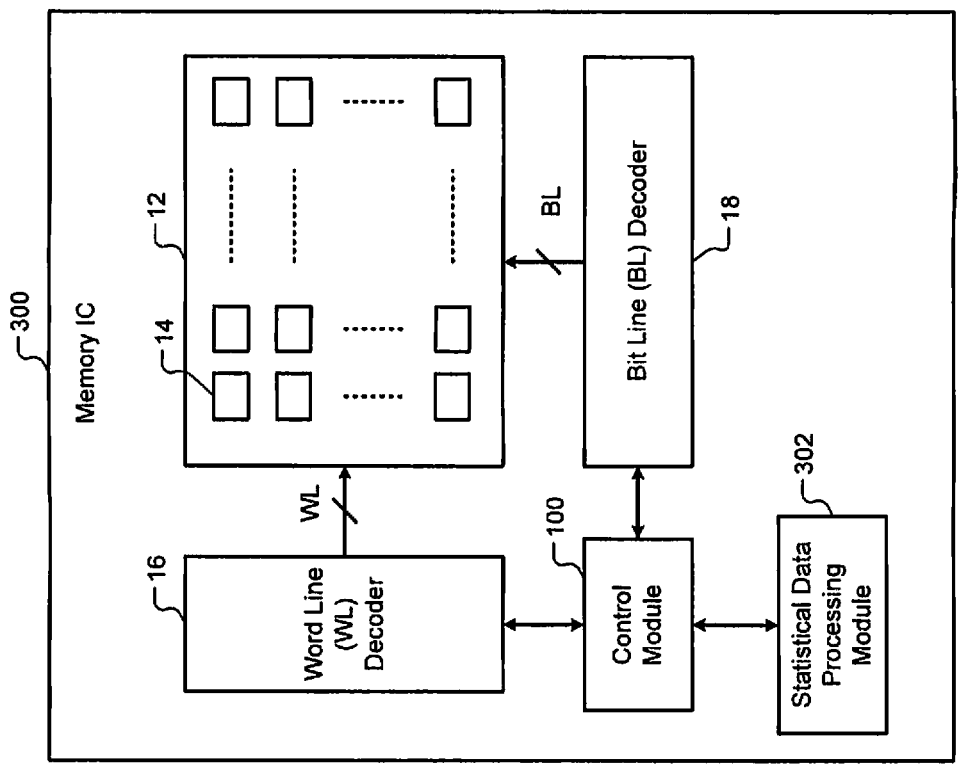
FIG. 14 is a functional block diagram of a memory integrated circuit (IC) comprising a statistical data processing module.

Referring now to FIG. 14, a memory IC 300 comprises the control module 100 and a statistical data processing module 302. The statistical data processing module 302 processes the stored statistical data to improve accuracy of read/write operations when drift due to cycling occurs. The statistical data processing module 302 is included in the memory IC 300 and processes the statistical data "on-chip" (i.e., in the memory IC 300). More specifically, the statistical data processing module 302 receives the statistical data that is generated by the statistical data generating module 116, that is stored in memory 118, and that is periodically updated by the statistical data generating module 116. The statistical data processing module 302 may perform sophisticated signal processing/detection including Viterbi detection and iterative decoding based on the statistical data stored in memory 118.

Figure 15:
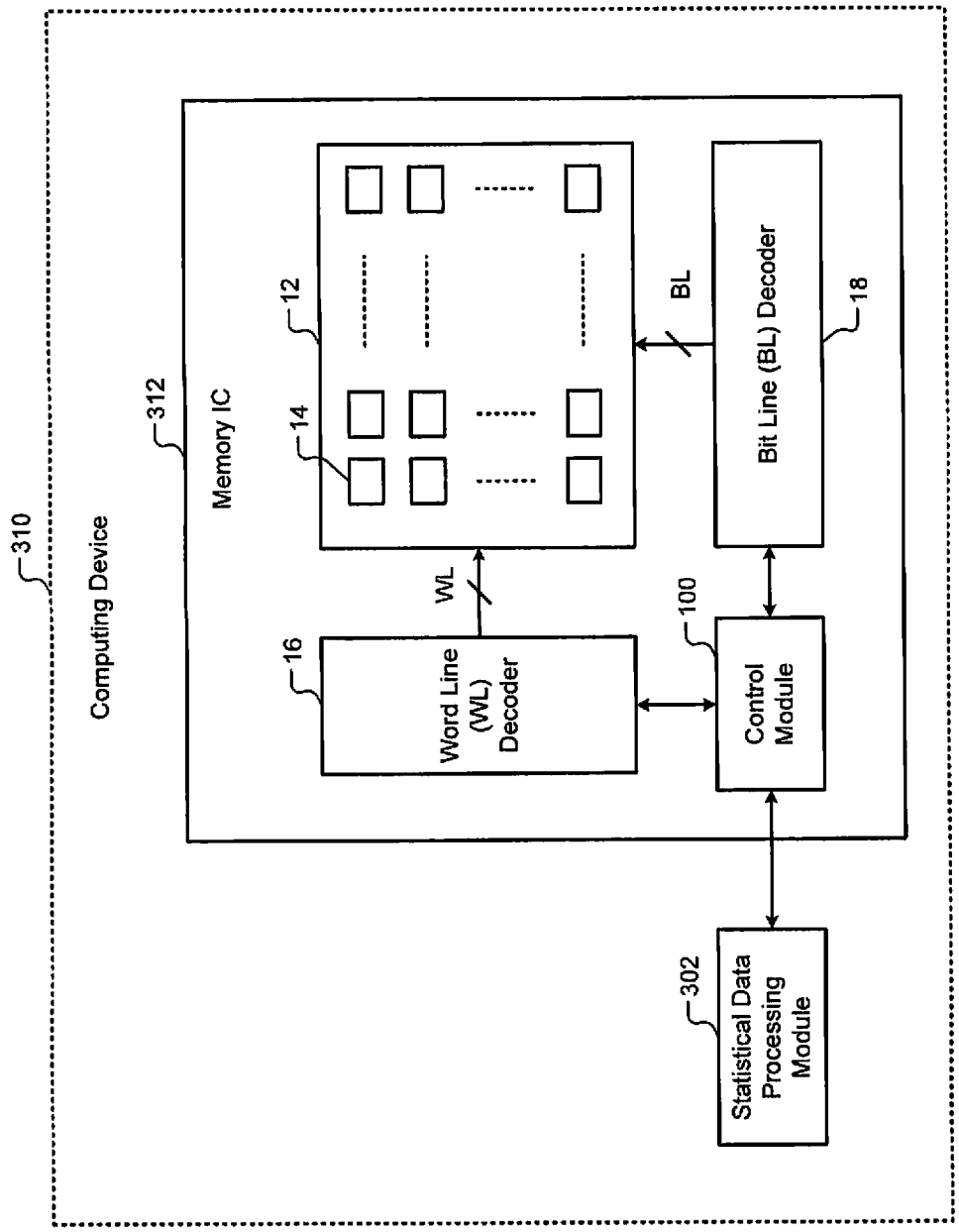
FIG. 15 is a functional block diagram of a computing device comprising a memory integrated circuit (IC) and a statistical data processing module.

Referring now to FIG. 15, a computing device 310 comprises a memory IC 312 and the statistical data processing module 302. The computing device may include a handheld computing device such as a laptop computer, a cellular phone, a personal digital assistant, an MP3 player, etc. The memory IC 312 comprises the control module 100. The statistical data processing module 302 is external to the memory IC 312 and processes the statistical data "off-chip" (i.e., outside the memory IC 312).

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A system comprising:
  a read module that reads charge levels of nonvolatile memory cells and that generates read signals;
  a statistical data generating module that generates statistical data based on the read signals, wherein the statistical data includes a mean and a standard deviation of each charge level distribution of the nonvolatile memory cells;
  a storing module that stores the statistical data; and
  a least mean square (LMS) module that generates mean values of the charge levels used to program the nonvolatile memory cells based on (i) differences between the read signals and delayed read signals and (ii) a scaling factor that is based on variations in the charge levels due to cycling of the nonvolatile memory cells,
  wherein the read module generates the read signals based on the charge levels of the nonvolatile memory cells and the statistical data.

2. The system of claim 1 further comprising an updating module that updates the statistical data stored in the storing module based on the read signals.

3. The system of claim 1, wherein the statistical data includes a variance of each charge level distribution of the nonvolatile memory cells.

4. The system of claim 1 further comprising an updating module that conditionally updates the statistical data stored in the storing module based on at least one of a number of read errors detected during read operations and a number of program operations of the nonvolatile memory cells.

5. The system of claim 1, wherein the storing module stores the mean values of the charge levels used to program the nonvolatile memory cells, and the system further comprising an updating module that conditionally updates the mean values based on the statistical data.

6. The system of claim 5 further comprising a program module that programs the nonvolatile memory cells using the mean values updated by the updating module.

7. The system of claim 1 further comprising a program module that programs the nonvolatile memory cells and that selects an error correcting code (ECC) to program the nonvolatile memory cells based on the statistical data.

8. The system of claim 1, wherein the statistical data generating module comprises:
  a detecting module that generates data based on the read signals;
  a signal reconstructing module that generates reconstructed signals based on the data;
  a delay buffer that buffers the read signals and that outputs the delayed read signals; and
  a difference module that generates differences between the reconstructed signals and the delayed read signals.

9. A memory integrated circuit (IC) comprising the system of claim 1 and further comprising a memory array that includes the nonvolatile memory cells.

10. The system of claim 1 further comprising a statistical data processing module that processes the statistical data stored in the storing module using at least one of Viterbi detection and iterative decoding.

11. A method comprising:
  reading charge levels of nonvolatile memory cells;
  generating statistical data based on the reading, wherein the statistical data includes a mean and a standard deviation of each charge level distribution of the nonvolatile memory cells;
  storing the statistical data;
  generating read signals based on the charge levels and the statistical data when the nonvolatile memory cells are read; and
  generating, by a least mean square (LMS) module, mean values of the charge levels used to program the nonvolatile memory cells based on (i) differences between the read signals and delayed read signals and (ii) a scaling factor that is based on variations in the charge levels due to cycling of the nonvolatile memory cells.

12. The method of claim 11 further comprising updating the statistical data based on the read signals.

13. The method of claim 11 further comprising generating a variance of each charge level distribution of the nonvolatile memory cells based on the read signals.

14. The method of claim 11 further comprising conditionally updating the statistical data based on at least one of a number of read errors detected during read operations and a number of program operations of the nonvolatile memory cells.

15. The method of claim 11 further comprising detecting states of the nonvolatile memory cell based on the statistical data that is stored and that is updated based on at least one of a number of read errors detected during read operations and a number of program operations of the nonvolatile memory cells.

16. The method of claim 11 further comprising:
storing the mean values of the charge levels used to program the nonvolatile memory cells;
generating updated mean values by conditionally updating the mean values based on the statistical data; and
programming the nonvolatile memory cells using the updated mean values.

17. The method of claim 11 further comprising selecting an error correcting code (ECC) to program the nonvolatile memory cells based on the statistical data.

18. The method of claim 11 further comprising updating the statistical data during read operations of the nonvolatile memory cells.

19. The method of claim 11 further comprising generating the statistical data by:
generating data based on the read signals;
generating reconstructed signals based on the data;
buffering the read signals;
outputting the delayed read signals; and
generating differences between the reconstructed signals and the delayed read signals.

* * * * *